United States Patent [19]

Murphy et al.

[11] Patent Number: 4,944,858
[45] Date of Patent: Jul. 31, 1990

[54] METHOD FOR APPLYING DIFFUSION ALUMINIDE COATING

[75] Inventors: Kenneth S. Murphy, Jupiter; Robert E. Hendricks, Port St. Lucie, both of Fla.; Richard J. Fenton, Glastonbury, Conn.

[73] Assignee: United Technologies Corporation, Hartford, Conn.

[21] Appl. No.: 281,161

[22] Filed: Dec. 8, 1988

[51] Int. Cl.$^5$ .............................................. C23C 14/35
[52] U.S. Cl. ............................ 204/192.15; 204/192.16
[58] Field of Search ....................... 204/192.15, 192.16

[56] References Cited

U.S. PATENT DOCUMENTS

| | | | |
|---|---|---|---|
| Re. 30,082 | 8/1979 | Atlee et al. | 313/57 |
| 3,464,907 | 9/1969 | Froemel et al. | 204/192 |
| 3,544,348 | 12/1970 | Boone et al. | 117/2 |
| 3,928,026 | 12/1975 | Hecht et al. | 75/134 F |
| 4,090,941 | 5/1978 | Wright et al. | 204/298 |
| 4,132,816 | 1/1979 | Bender et al. | 427/237 |
| 4,468,437 | 8/1984 | Patter et al. | 428/553 |
| 4,585,481 | 4/1986 | Gupta et al. | 106/14.05 |
| 4,684,454 | 8/1987 | Gardner | 204/192.2 |
| 4,699,702 | 10/1987 | Mirakata et al. | 204/192.2 |

*Primary Examiner*—Nam X. Nguyen
*Attorney, Agent, or Firm*—James M. Rashid

[57] ABSTRACT

Sputtering techniques are utilized to form an aluminum rich diffusion coating on the surface of a superalloy substrate. The coating contains additions of oxygen active elements, such as yttrium, and the coating has an outward diffusion aluminide microstructure obtained by carrying the sputtering process out at temperatures in the range of about 1,010°–1,150° C.

8 Claims, 3 Drawing Sheets

METHOD FOR APPLYING DIFFUSION ALUMINIDE COATING

TECHNICAL FIELD

This invention relates to sputtered coatings; in particular, it relates to sputtered coatings which are oxidation resistant, and methods for applying such coatings.

BACKGROUND

Oxidation resistant coatings are needed for components which operate in the high temperature section of gas turbine engines and other types of turbomachinery. Typical of such coatings are the diffusion aluminide coatings such as those described in commonly assigned U.S. Pat. Nos. 3,544,348 to Boone et al and 4,132,816 to Benden et al. Another type of such oxidation resistant coatings are generally referred to as MCrAlY overlay coatings, as described in commonly assigned U.S. Pat. Nos. 3,928,026 to Hecht et al and 4,585,481 to Gupta et al. Overlay coatings are distinguished from diffusion coatings in that overlay coatings are discrete layers upon the substrate surface, and there is little or no chemical diffusion between the coating and the substrate. In contrast, diffusion coatings are (as their name implies) diffused with the substrate. Sputtered coatings are generally considered to be of the overlay type; see, e.g., U.S. Pat. No. 4,090,941 to Wright et al. Sputtered coatings have, however, not yet met their full potential in the gas turbine engine industry due, in part, to the inability to deposit coating compositions having the necessary combination of resistance to oxidation and fatigue degradation. This invention seeks to fill that need.

SUMMARY OF THE INVENTION

According to this invention, sputtering processes are used to form an aluminide type coating diffused with the surface of a metal alloy component. In particular, oxidation resistant diffusion aluminide coatings are formed by simultaneously sputtering aluminum and at least one oxygen active element onto a superalloy substrate at conditions sufficient to form a diffusion coating wherein the coating contains approximately 15-30 weight percent aluminum and approximately 0.01-2.0 percent of an oxygen active element. A key feature of the invention coating is that it has an outward type diffusion aluminide coating microstructure. Such coatings have a desirable combination of resistance to thermal fatigue cracking and oxidation degradation.

One of the important aspects of this invention is the relatively high temperature at which the sputtering process takes place. Such high temperatures are necessary to achieve the outward diffusion coating microstructure and a distribution of the oxygen active element (or elements) throughout the coating.

The term "oxygen active element" includes those elements in the lanthanide and actinide series (i.e., atomic numbers 57-71 and 89-103, inclusive) as well as yttrium (atomic number 39) and hafnium (atomic number 72). The preferred oxygen active element in this invention is yttrium.

Coatings made according to this invention have excellent resistance to oxidation degradation and thermal fatigue cracking, and accordingly are candidate coatings for use in the gas turbine engine and turbomachinery industry. Other advantages and features of the invention will be apparent from the description below, read in conjunction with the drawings.

BEST MODE FOR CARRYING OUT THE INVENTION

Figure 2:
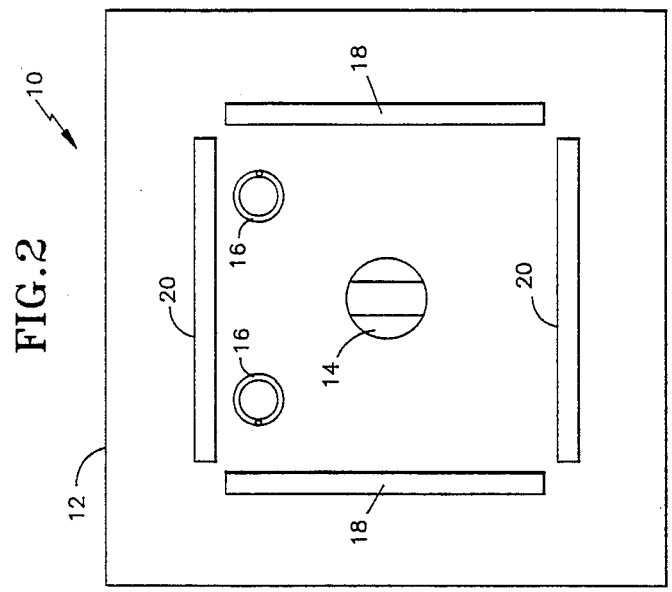
FIGS. 1 and 2 are schematic views of the sputtering apparatus used in this invention.
Figure 1:
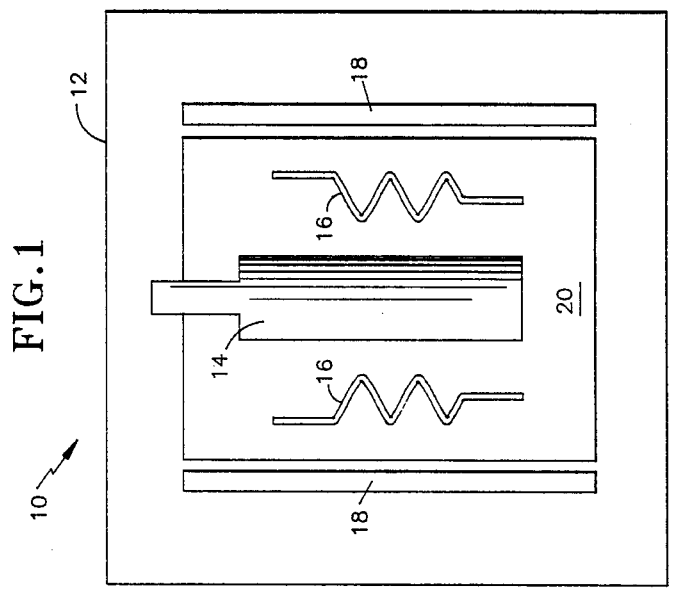

FIGS. 1 and 2 are simplified schematic views showing the apparatus 10 useful in applying the coating of this invention. As is typical of sputtering apparatus known to those skilled in the art, a chamber 12 surrounds the working elements of the apparatus 10, and includes typical vacuum pumps and associated equipment (not shown) for attaining a vacuum level of at least about $5 \times 10^{-7}$ Torr and maintaining a vacuum level of at least about $3 \times 10^{-5}$ Torr during the sputtering process. The apparatus 10 also includes means (not shown) for introducing an inert gas such as krypton into the chamber 12 during the sputtering process, and means for imparting the necessary electrical inputs to the substrate 14 being coated, the tungsten filaments 16 and the coating targets 18, 20 during the coating process, in the manner defined in more detail below.

During the sputtering process according to this invention, electrons are emitted from the tungsten filaments 16 and are drawn towards the substrate 14, which is positively charged. Bombardment of the substrate 14 by the electrons causes the substrate temperature to increase to the necessary range of about 1,010°-1,150° C. (about 1,850°-2,100 F.). This relatively high temperature range is necessary to achieve the desired outward diffusion coating microstructure. As the electrons are emitted from the tungsten filaments 16, some of the electrons collide with the krypton atoms introduced into the chamber 12 to form positively charged Kr ions. These ions are then attracted to the negatively charged coating targets 18, 20, and cause atoms of the targets 18, 20 to be sputtered from target surface. The sputtered target atoms form a flux of coating material which becomes deposited upon the surface of the substrate 14.

As indicated above, a particular feature of the invention is the temperature at which the sputtering process takes place. Optimum coating properties are attained when the coating has an outward diffusion aluminide coating microstructure, principally characterized by two distinct zones, as shown by the coating 30 in FIG. 3. The outer coating zone 32 is beta NiAl containing about 0.01-2 percent of the oxygen active element, and the inner coating zone 34 has a beta matrix with refractory metal precipitates.

Outward diffusion aluminide coatings are formed when the coating application parameters (primarily temperature and aluminum activity) are such to promote the diffusion of aluminum into the substrate surface and diffusion of the substrate elements outwardly towards the substrate surface. Outward type diffusion coatings are further characterized by a thickness of less than about 100 microns (about 4 mils), preferably about 50-75 microns, which results in excellent resistance to thermal-mechanical fatigue. By contrast, inward diffusion aluminide coatings are formed when aluminum activities are high and application temperatures are low. Inward diffusion coatings are characterized by a three zone coating microstructure; fatigue tests have shown that inward diffusion aluminide coatings have poorer fatigue properties than do aluminide coatings of the outward type.

The diffusion coating microstructure formed by this invention is distinguished from the overlay coatings formed by the prior art sputtering process, wherein little or no diffusion between the coating and substrate takes place. Furthermore, the invention coating is compositionally characterized by the presence of the oxygen active elements in the coating. This is achieved primarily by the relatively high coating temperatures (in the range of about 1,010°–1,150° C.) used in the invention process, which results in a relatively uniform distribution of the oxygen active elements in the outer coating zone. Some of the oxygen active element may be present in the coating as precipitates. When low coating application temperatures are used (e.g., about 760° C.) the active elements are not incorporated throughout the outer coating zone, but rather, remain concentrated upon the coating surface.

The invention will be better understood by reference to the following example which is meant to illustrate the features of the invention but not to limit the scope of the invention. Nickel base superalloy specimens having a composition on a weight percent basis of about 10Cr-5Co-1.5Ti-5Al-4W-12Ta-balance Ni were suspended within a triode sputtering chamber of the type described in the aforementioned patent to Wright, the contents of which are incorporated by reference. There were three coating targets located in the chamber; two were commercial purity aluminum and one was commercially pure aluminum with a pure yttrium insert The surface area ratio of aluminum to yttrium was about 30:1; the surface area ratio of Al:Y is considered to approximate the atomic percent ratio of such elements Results of various coating tests are summarized in Table I; these data show that the optimum coating was achieved when the anode (substrate) voltage was about 25 volts and the anode current was maintained in the range of about 16–30 amperes by adjusting the filament voltage. Target voltage was set at about −500 volts and the target current was about 0.5 amperes. These conditions resulted in a relatively slow deposition rate, due to a low aluminum activity; the deposition rate was about 6–8 microns per hour which provided the desired outward diffusion aluminide coating. For all trials, krypton gas was bled into the chamber at a rate sufficient to maintain a chamber pressure of about $2.5 \times 10^{-3}$ Torr; total system pressure was about $3 \times 10^{-5}$ torr. After the sputtering process, the coated specimens were removed from the coating chamber and diffusion heat treated at about 1080° C. (1,975° F.) for four hours in an inert atmosphere.

Figure 3:
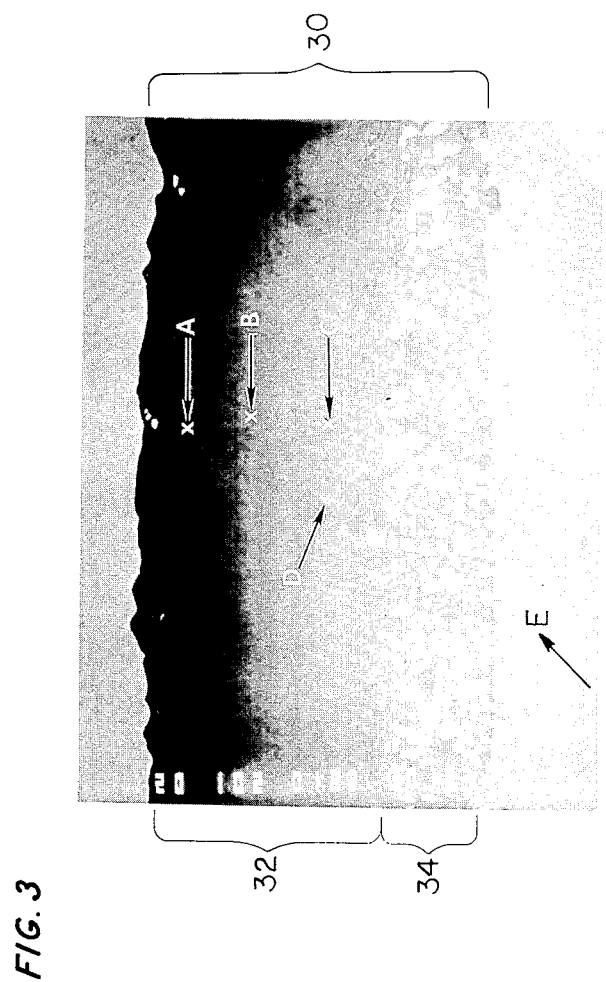
FIG. 3 is a photomicrograph showing a cross-sectional view of the coating formed by the invention process.

FIG. 3 is representative of the coating formed by the processes described above. Electron microscope x-ray mapping indicated that the composition of the areas identified as A, B, C, and D in the Figure was as indicated in Table 2. The aluminum content in the outer zone of the coating ranged from (on a weight percent basis), about 17.7% to 24.3%, while the yttrium content ranged from about 0.15% to 0.5%. The area identified as "D" in Table 2 and FIG. 3 is an yttrium rich precipitate in the outer coating zone. Based upon an analysis of the overall coating, the average aluminum content was about 20.5%, and the average yttrium content about 0.4%. As indicated in the Table, the substrate (prior to coating) contained 5% aluminum and 0% yttrium.

Figure 4:
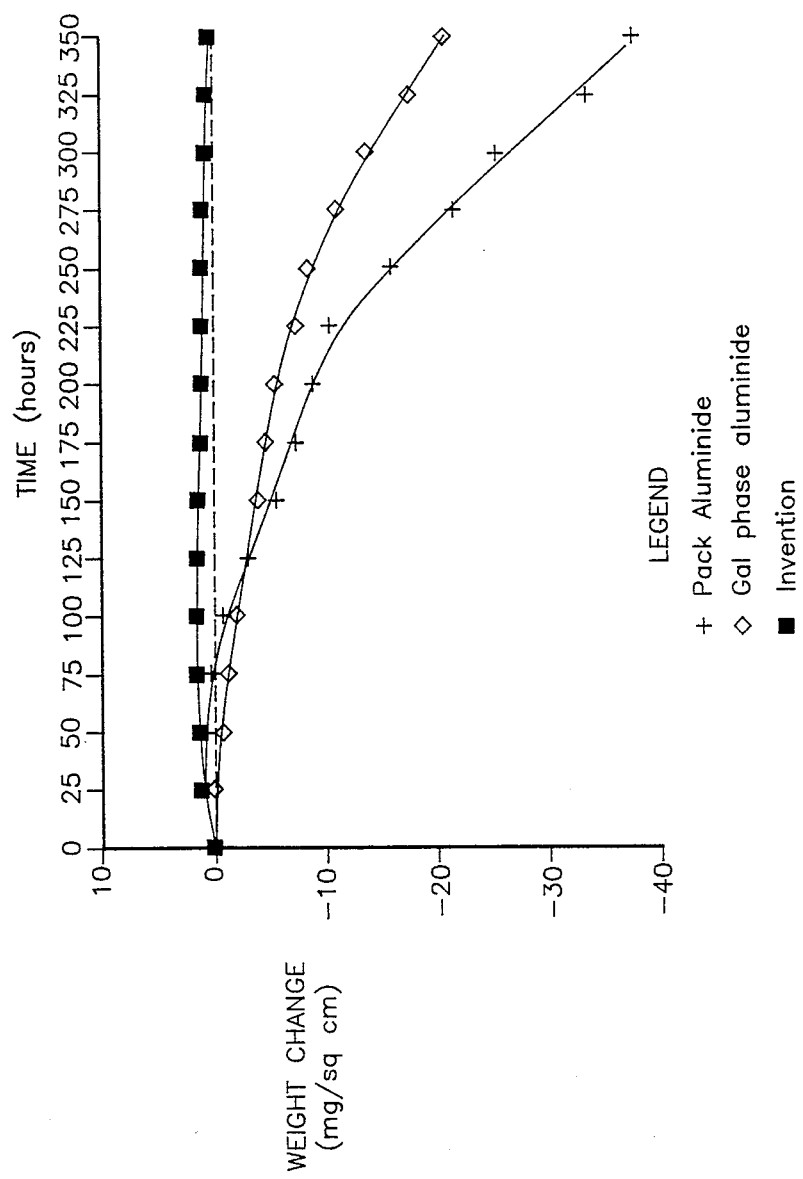
FIG. 4 shows the superiority of coatings applied by the invention process, as compared to coatings of the prior art.

Cyclic oxidation of specimens coated in accordance with this invention revealed their superiority as compared to coatings formed by prior art diffusion aluminide techniques. As shown in FIG. 4, the invention coatings exhibited little or no oxidation degradation (as indicated by little or no weight change as a function of time) compared to aluminide coatings formed by prior art pack and gas phase techniques.

Although this invention has been shown and described with respect to the preferred embodiment thereof, it should be understood by those skilled in the art that various changes in form and detail may be made without departing from the spirit and scope of the claimed invention. For example, separate aluminum and oxygen active element targets can be utilized in carrying out the invention process, or alloyed targets can be used. It is believed that when yttrium is the oxygen active element used, the target atomic percent ratio of Al:Y should range from about 25:1 to about 50:1, preferably about 30:1. Such ranges will produce coatings containing the desired outward diffusion aluminide structure containing about 18–30 Al and 0.01–2 Y when the substrate is similar to the nickel base superalloy described above (which contained 5 percent Al). Those skilled in the art will be able to determine the necessary modification in Al:Y target ratio when the substrate contains a substantially different level of aluminum, or when the use of an oxygen active element other than yttrium is preferred.

TABLE I

| | SPUTTERING PARAMETERS | | |
|---|---|---|---|
| Specimen | Anode Voltage (Volts) | Anode Current (Amperes) | Results; Coating Thickness |
| A | 30 | 23–29 | Interfacial melting; 82.5 microns |
| B | 30 | 22–29 | Interfacial melting; 72.5 microns |
| C | 28 | 20 | Minor interfacial melting; 95 microns |
| D | 25 | 16 | Excellent; 62.5 microns |
| E | 25 | 20 | Excellent; 47.5 microns |
| F | 25 | 24 | Excellent; 54 microns |
| G | 25 | 30 | Excellent; 64 microns |
| H | 25 | 29 | Excellent; 60 microns |
| I | 25 | 25 | Interfacial melting; 112.5 microns |
| J | 25 | 22 | Good; 75 microns |

TABLE II

| COMPOSITIONAL ANALYSIS OF COATING IN FIG. 3 | | | | | | | | |
|---|---|---|---|---|---|---|---|---|
| | Element | | | | | | | |
| Location | Ni | Co | Cr | Ta | W | Ti | Al | Y |
| A | 67.9 | 3.7 | 1.8 | 1.9 | 0.1 | 0.2 | 24.3 | 0.2 |
| B | 66.5 | 4.1 | 3.6 | 3.2 | 0.3 | 0.5 | 21.2 | 0.5 |
| C | 64.4 | 4.9 | 5.4 | 6.1 | 0.3 | 1.0 | 17.8 | 0.2 |
| D | 60.1 | 4.4 | 5.5 | 6.5 | 0.2 | 1.0 | 16.3 | 5.6 |
| E | 62.5 | 5.0 | 10.0 | 12.0 | 4.0 | 1.5 | 5.0 | 0.0 |

We claim:

1. A process for forming an oxidation resistant diffusion aluminide coating on a superalloy substrate, comprising the steps of simultaneously sputtering aluminum and an oxygen active element onto the substrate at conditions to diffuse aluminum and the oxygen active element into the substrate to form an outward diffusion aluminide coating microstructure characterized by an outer coating zone and and an inner coating zone, wherein the outer coating zone contains approximately 15–30 percent aluminum and 0.01–2.0 percent oxygen active element.

2. The process of claim 1, wherein aluminum and the oxygen active element are sputtered from separate targets.

3. The process of claim 1, wherein aluminum and the oxygen active element are sputtered from an alloyed target of aluminum and said active element.

4. The process of claim 1, wherein the substrate is heated to a temperature between about 1,010° and 1,150° C. during the coating process.

5. The process of claim 1, wherein the oxygen active element is yttrium.

6. The process of claim 1, wherein the atomic percent ratio of the aluminum to the oxygen active element is about 25:1 to 50:1.

7. The process of claim 6, wherein the atomic percent ratio of aluminum to the oxygen active element is about 30:1.

8. A process for forming an oxidation resistant diffusion aluminide coating on a superalloy substrate, comprising the steps of sputtering aluminum and an oxygen active element onto the substrate at conditions to form an outward diffusion aluminide coating microstructure characterized by an outer coating zone containing beta-NiAl, approximately 15–30 weight percent aluminum and 0.01–2.0 weight percent oxygen active element and an inner coating zone having a beta matrix and refractory metal precipitates, where the combined thickness of the outer and inner coating zones is about 100 microns or less.

* * * * *